(12) United States Patent
Iwasaki et al.

(10) Patent No.: US 7,419,567 B2
(45) Date of Patent: Sep. 2, 2008

(54) PLASMA PROCESSING APPARATUS AND METHOD

(75) Inventors: Masahide Iwasaki, Nirasaki (JP); Koji Miyata, Takefu (JP)

(73) Assignees: Tokyo Electron Limited, Tokyo (JP); Shin-Etsu Chemical Co., Ltd., Tokyo (JP)

( * ) Notice: Subject to any disclaimer, the term of this patent is extended or adjusted under 35 U.S.C. 154(b) by 294 days.

(21) Appl. No.: 11/092,910

(22) Filed: Mar. 30, 2005

(65) Prior Publication Data

US 2005/0224344 A1 Oct. 13, 2005

(30) Foreign Application Priority Data

Apr. 8, 2004 (JP) ............................. 2004-114247

(51) Int. Cl.
*H01L 21/00* (2006.01)
*C23C 16/00* (2006.01)
*C23C 14/00* (2006.01)

(52) U.S. Cl. ............................ 156/345.46; 156/345.49; 118/723 MR; 118/723 MA; 204/298.33

(58) Field of Classification Search ............ 204/298.01, 204/298.16, 298.31, 298.37; 156/345; 219/121.43; 335/209, 306; 118/723 MR, 723 E, 723 MA, 118/723 I, 723 MW
See application file for complete search history.

(56) References Cited

U.S. PATENT DOCUMENTS 5,081,398 A * 1/1992 Asmussen et al. ...... 315/111.41
5,397,956 A * 3/1995 Araki et al. ............. 313/231.31
5,401,351 A * 3/1995 Samukawa .............. 156/345.49
5,444,207 A * 8/1995 Sekine et al. ........... 219/121.43
5,718,795 A * 2/1998 Plavidal et al. ......... 156/345.46
6,014,943 A * 1/2000 Arami et al. ............. 118/723 E
6,514,377 B1 * 2/2003 Morimoto ............... 156/345.46

FOREIGN PATENT DOCUMENTS

JP 04-280430 * 6/1992
JP 2003-124198 4/2003

* cited by examiner

*Primary Examiner*—Ram N Kackar
(74) *Attorney, Agent, or Firm*—Oblon, Spivak, McClelland, Maier & Neustadt, P.C.

(57) ABSTRACT

A plasma processing apparatus includes a worktable in a process chamber to horizontally place a target substrate thereon. A plasma generation space is defined above and around the worktable within the process chamber. The plasma generation space includes a peripheral plasma region and a main plasma region respectively located outside and inside an outer edge of the target substrate placed on the worktable. The apparatus further includes a magnetic field forming mechanism configured to form first, second, and third magnetic fields within the peripheral plasma region. The first magnetic field includes magnetic force lines extending along a vertical first cylindrical plane. The second magnetic field includes magnetic force lines extending along a vertical second cylindrical plane located inside the first cylindrical plane. The third magnetic field includes magnetic force lines extending along vertical radial planes located between the first and second cylindrical planes.

15 Claims, 6 Drawing Sheets

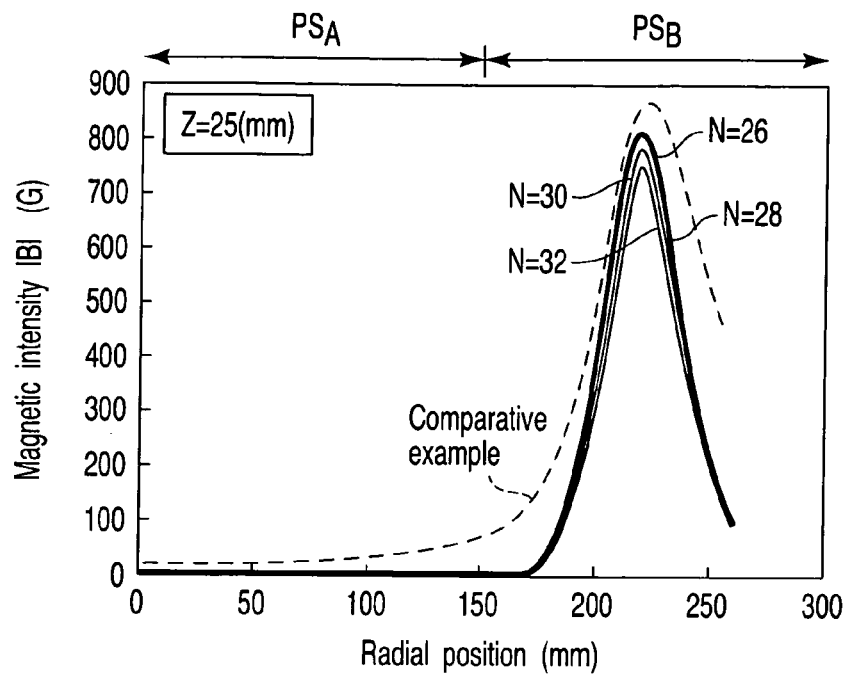
F I G. 5 A
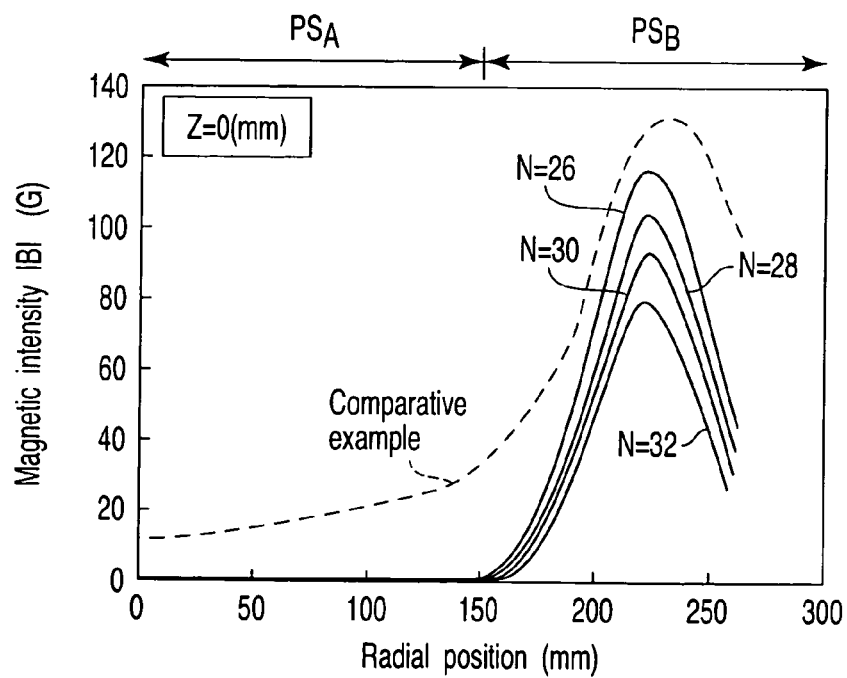
F I G. 5 B

PLASMA PROCESSING APPARATUS AND METHOD

CROSS-REFERENCE TO RELATED APPLICATIONS

This application is based upon and claims the benefit of priority from prior Japanese Patent Application No. 2004-114247, filed Apr. 8, 2004, the entire contents of which are incorporated herein by reference.

BACKGROUND OF THE INVENTION

1. Field of the Invention

The present invention relates to an apparatus and method for performing a plasma process on a target substrate, and particularly to a semiconductor processing apparatus and method of the single substrate type which utilize radio frequency (RF) discharge to generate plasma. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices and FPDs (Flat Panel Display), plasma is often used for processes, such as etching, deposition, oxidation, and sputtering, so that process gases can react well at a relatively low temperature. Plasma generation systems used for semiconductor processing apparatuses (plasma processing apparatuses) are classified broadly into the type utilizing glow discharge or RF discharge, and the type utilizing microwaves.

In general, a plasma processing apparatus of the single substrate type utilizing RF discharge includes a process chamber configured to reduce the pressure therein, and a worktable or susceptor disposed in the process chamber and functioning as an electrode as well. A target substrate, such as a semiconductor wafer or a glass substrate, is placed on the susceptor. Then, the pressure within the process chamber is reduced to a predetermined vacuum level, and a process gas is supplied into the process chamber. When the gas pressure within the process chamber comes to a set value, an RF power is applied to the electrode. With this arrangement, the process gas starts electric discharge, thereby generating gas plasma. Using this plasma, a micro fabrication process, such as dry etching, or a film-formation process, such as chemical vapor growth, is performed on a surface or target portion of the substrate.

In such a plasma processing apparatus utilizing RF discharge, as the gas pressure is set low, the density of gas molecules becomes low, thereby making it difficult to start electric discharge (plasma ignition) or sustain the electric discharge. Particularly, where the plasma processing apparatus is of a parallel-plate type, this characteristic is prominent, and, even if the inter-electrode gap is set smaller, or the RF voltage applied across the electrodes is set larger, the energy given to electrons from the electric field, i.e., energy for ionizing gas molecules or atoms, is insufficient, thereby likely making electric discharge unstable. However, as the case may be, plasma processes use a low gas pressure, small inter-electrode gap, or low RF applied voltage, as preferable process conditions. For example, anisotropic etching preferably uses a low gas pressure to obtain a vertically etched shape in a desired state, and thus requires characteristics for starting electric discharge and sustaining the electric discharge within a low pressure range.

As a conventional technique in this field, an ignition plasma method is known, which uses initial conditions to start electric discharge, and then switches them to the main process conditions after the electric discharge has stabilized. Used as the initial conditions suitable for electric discharge are conditions employing a specific high pressure (for example, Jpn. Pat. Appln. KOKAI Publication No. 2003-124198), a different gas, or a high RF power. A method of assisting plasma generation by microwaves or UV rays is also known as being effective.

However, since the ignition plasma method uses conditions different from the main process conditions for a certain period of time, there are some disadvantages in that the process is affected and the throughput is reduced. Similarly, as regards the method employing microwaves or UV rays, there are also some problems in that the process may be affected, and the apparatus becomes complex, which increases the apparatus cost. As a consequence, conventionally, there is no choice but to adopt the type utilizing microwaves, such as ECR (Electron Cyclotron Resonance), in applications for generating plasma under a low pressure.

BRIEF SUMMARY OF THE INVENTION

An object of the present invention is to provide a plasma processing apparatus and method, which can easily start RF discharge and stably sustain the electric discharge with a simple and low cost structure.

Another object of the present invention is to provide a plasma processing apparatus and method, which can effectively confine plasma at a high density above a target substrate to improve the reaction rate and planar uniformity of a plasma process.

According to a first aspect of the present invention, there is provided a plasma processing apparatus comprising:

a process chamber configured to reduce a pressure therein;

a worktable disposed in the process chamber and configured to place a target substrate thereon in an essentially horizontal state, a plasma generation space being defined above and around the worktable within the process chamber, and the plasma generation space including a peripheral plasma region and a main plasma region respectively located outside and inside an outer edge of the target substrate placed on the worktable;

a process gas supply section configured to supply a process gas into the plasma generation space;

an electric field forming mechanism configured to form an RF electric field within the plasma generation space; and a magnetic field forming mechanism configured to form first, second, and third magnetic fields within the peripheral plasma region, the first magnetic field comprising magnetic force lines extending substantially along an essentially vertical first cylindrical plane, the second magnetic field comprising magnetic force lines extending substantially along an essentially vertical second cylindrical plane located inside the first cylindrical plane, and the third magnetic field comprising magnetic force lines extending substantially along a plurality of essentially vertical radial planes located between the first and second cylindrical planes.

In the case of the apparatus according to the first aspect, the magnetic field forming mechanism forms the first, second, and third magnetic fields extending on essentially vertical planes within the peripheral plasma region. With this arrangement, when the electric field forming mechanism forms an RF electric field within the plasma generation space, the process gas starts electric discharge first at the peripheral plasma region in which the magnetic fields are present. Then, the electric discharge instantaneously spreads over the entire plasma generation space, thereby establishing glow discharge or plasma generation. The RF discharge thus started is assisted or sustained thereafter also by the magnetic fields formed within the peripheral plasma region. As a consequence, as long as the etching gas and the RF power are supplied, electric discharge or plasma generation is stably sustained within the entire plasma generation space. As described above, the magnetic fields formed within the peripheral plasma region trigger start of RF discharge and assist sustainment of the electric discharge. As a consequence, it is possible to easily start the electric discharge and stably sustain the electric discharge, even under conditions with, e.g., a low gas pressure.

The magnetic field forming mechanism may be configured to set the main plasma region to have substantially no magnetic field. As a consequence, it is possible to prevent or reduce the probability that the target substrate is affected by a magnetic field and thereby damaged or given stress.

The magnetic field forming mechanism forms a magnetic field (first, second, and third magnetic fields) vertically extending like a curtain surrounding the main plasma region. This prevents plasma from flowing out of the main plasma region, and thus effectively and efficiently confines the plasma therein. As a consequence, the plasma can have a higher density and higher uniformity within the main plasma region, thereby improving the reaction rate and planar uniformity of the plasma process.

The magnetic field is formed within the magnetic field forming mechanism such that at least one group of the start positions and the end positions of the magnetic force lines are disposed radially inside a sidewall of the process chamber. This can minimize the number and size of magnetic pole members corresponding to the start positions or the end positions disposed at the inner side, in forming a magnetic field of a high density within the peripheral plasma region.

It may be arranged such that the magnetic field forming mechanism comprises first N-poles and first S-poles alternately disposed at intervals in an annular direction and facing downward above the first cylindrical plane. In this case, the magnetic force lines of the first magnetic field make U-turns extending through the peripheral plasma region from start positions defined by the first N-poles to end positions defined by the first S-poles.

It may also be arranged such that the magnetic field forming mechanism comprises second N-poles and second S-poles alternately disposed at intervals in an annular direction and facing downward above the second cylindrical plane. In this case, the magnetic force lines of the second magnetic field make U-turns extending through the peripheral plasma region from start positions defined by the second N-poles to end positions defined by the second S-poles.

It may also be arranged such that one of the first N-poles and one of the second S-poles are disposed at an interval, or one of the first S-poles and one of the second N-poles are disposed at an interval, above each of the radial planes. In this case, the magnetic force lines of the third magnetic field make U-turns extending through the peripheral plasma region from start positions defined by the first and second N-poles to end positions defined by the first and second S-poles.

According to a second aspect of the present invention, there is provided a plasma process method comprising:

placing a target substrate in an essentially horizontal state within a process chamber configured to reduce a pressure therein, a plasma generation space being defined within the process chamber, and the plasma generation space including a peripheral plasma region and a main plasma region respectively located outside and inside an outer edge of the target substrate;

supplying a process gas into the plasma generation space;

forming an RF electric field within the plasma generation space; and forming first, second, and third magnetic fields within the peripheral plasma region, the first magnetic field comprising magnetic force lines extending substantially along an essentially vertical first cylindrical plane, the second magnetic field comprising magnetic force lines extending substantially along an essentially vertical second cylindrical plane located inside the first cylindrical plane, and the third magnetic field comprising magnetic force lines extending substantially along a plurality of essentially vertical radial planes located between the first and second cylindrical planes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5A is a graph showing magnetic field intensity distributions according to present examples (on the bottom surface of the upper electrode) within a plasma generation space;

FIG. 5B is a graph showing the magnetic field intensity distributions according to present examples (on the top surface of a wafer) within the plasma generation space;

DETAILED DESCRIPTION OF THE INVENTION

Figure 1:
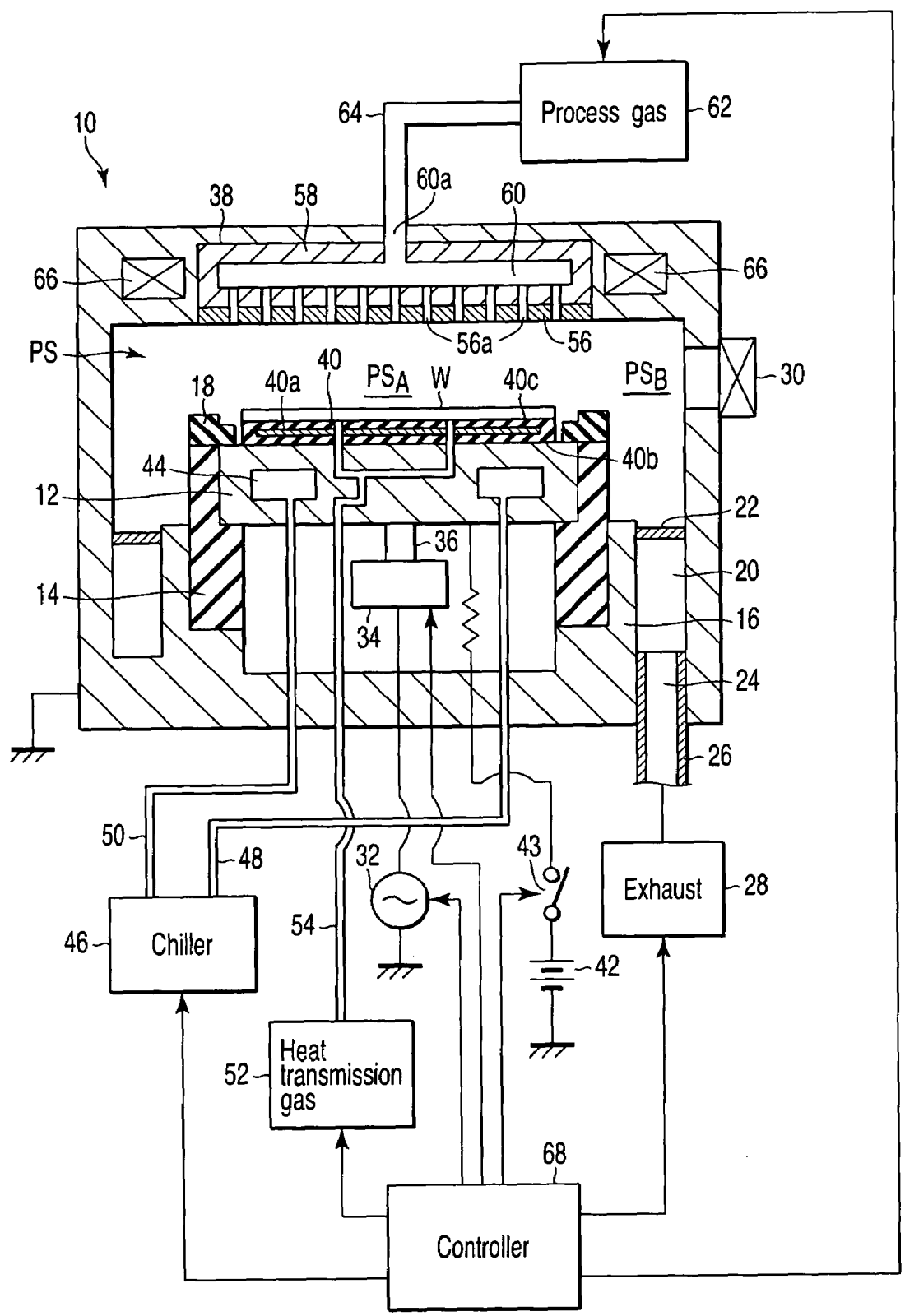
FIG. 1 is a sectional view showing a plasma processing apparatus for a semiconductor process according to an embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

FIG. 1 is a sectional view showing a plasma processing apparatus for a semiconductor process according to an embodiment of the present invention. This plasma processing apparatus is structured as a plasma etching apparatus of a parallel-plate type. The plasma etching apparatus includes a cylindrical process chamber (process container) 10, which is made of a metal, such as aluminum or stainless steel, and is protectively grounded.

The process chamber 10 is provided with a circular lower electrode or susceptor (worktable) 12 disposed therein, on which a target substrate or semiconductor wafer W is placed. The susceptor 12 is made of, e.g., aluminum, and is supported through an insulative cylindrical holder 14 on a cylindrical support portion 16, which extends vertically upward from the bottom of the process chamber 10. A focus ring 18 made of, e.g., quartz is disposed on top of the cylindrical holder 14 to annularly surround the top surface of the susceptor 12.

An exhaust passage 20 is defined between the sidewall of the process chamber 10 and the cylindrical support portion 16. The exhaust passage 20 is provided with a circular baffle plate 22 attached at the entrance or middle, and an exhaust port 24 formed at the bottom. The exhaust port 24 is connected to an exhaust apparatus 28 through an exhaust line 26. The exhaust apparatus 28 includes a vacuum pump for reducing the pressure of the process space within the process chamber 10 to a predetermined vacuum level. A transfer port for a semiconductor wafer W is formed in the sidewall of the process chamber 10 and is opened/closed by a gate valve 30.

The susceptor 12 is electrically connected to a radio frequency (RF) power supply 32 for generating plasma, through a matching device 34 and a power feeding rod 36. The RF power supply 32 is arranged to apply an RF power of a predetermined frequency, such as 60 MHz, to the susceptor 12 used as a lower electrode. A showerhead 38 is disposed on the ceiling of the process chamber 10 to face the susceptor 12 in parallel therewith, and is used as an upper electrode with a ground potential, as described later. The RF power applied from the RF power supply 32 is used to form an RF electric field in the space between the susceptor 12 and showerhead 38, which is defined as a plasma generation space PS.

The plasma generation space PS mentioned herein is not limited to the space radially inside the outer edges of the susceptor 12 and showerhead 38, but expands through the space radially outside the outer edges up to the inner wall or sidewall of the process chamber 10. A region $PS_A$ of the plasma generation space PS radially inside the outer edge of a substrate W placed on the susceptor 12 is called a "main plasma region". A region $PS_B$ outside the "main plasma region", i.e., radially outside the outer edge of the substrate W, is called a "peripheral plasma region".

The susceptor 12 is provided with an electrostatic chuck 40 on the top, for holding the semiconductor wafer W by an electrostatic attraction force. The electrostatic chuck 40 comprises an electrode 40a made of a conductive film, and a pair of insulating films 40b and 40c sandwiching the electrode 40a. The electrode 40a is electrically connected to a direct-current (DC) power supply 42 through a switch 43. With a DC voltage applied from the DC power supply 42, the electrostatic chuck 40 attracts and holds the semiconductor wafer W on the chuck by a Coulomb force.

The susceptor 12 is further provided with a cooling medium space 44 formed therein and annularly extending therethrough. A cooling medium set at a predetermined temperature, such as cooling water, is circulated within the cooling medium space 44 from a chiller unit 46 through lines 48 and 50. The temperature of the cooling medium is set to control the process temperature of the semiconductor wafer W placed on the electrostatic chuck 40. Further, a heat transmission gas, such as He gas, is supplied from a heat transmission gas supply unit 52, through gas supply line 54, into the interstice between the top surface of the electrostatic chuck 40 and the bottom surface of the semiconductor wafer W.

The showerhead 38 disposed at the ceiling includes an electrode plate 56 on the bottom side having a number of gas delivery holes 56a, and an electrode support 58 detachably supporting the electrode plate 56. The electrode support 58 has a buffer space 60 formed therein, which has a gas feed port 60a connected to a process gas supply section 62 through a gas feed line 64.

A magnetic field forming mechanism 66 is disposed at the ceiling of the process chamber 10 directly above the peripheral plasma region $PS_B$ (preferably around the showerhead 38), and extends annularly or concentrically therewith. The magnetic field forming mechanism 66 serves to easily start RF discharge (plasma ignition) at the plasma generation space PS within the process chamber 10, and stably sustain the electric discharge. The structure and function of the magnetic field forming mechanism 66 will be described later in detail.

A control section 68 is arranged to control the operations of respective parts of the plasma etching apparatus, such as the exhaust apparatus 28, RF power supply 32, electrostatic chuck switch 43, chiller unit 46, heat transmission gas supply unit 52, and process gas supply section 62. The control section 68 is also connected to the host computer (not shown).

When the plasma etching apparatus is used for etching, the following operations are performed. Specifically, at first, the gate valve 30 is opened, and a semiconductor wafer W to be processed is transferred into the process chamber 10, and placed on the susceptor 12 in a horizontal state. Then, a DC voltage is applied from the DC power supply 42 to the electrode 40a of the electrostatic chuck 40, so as to fix the semiconductor wafer W onto the electrostatic chuck 40. Then, an etching gas (mixture gas in general) is supplied at a predetermined flow rate and flow ratio from the process gas supply section 62 into the process chamber 10, while the process chamber 10 is exhausted by the exhaust apparatus 28, to set the pressure within the process chamber 10 at a set value. In this state, an RF power is applied at a predetermined power level from the RF power supply 32 to the susceptor 12. With this arrangement, the etching gas delivered from the showerhead 38 is turned into plasma by electric discharge within the plasma generation space PS. The main surface of the semiconductor wafer W is etched by radicals and ions generated from the plasma.

According to the plasma etching apparatus, the magnetic field forming mechanism 66 disposed at the ceiling of the process chamber 10 forms a substantial magnetic field within the peripheral plasma region $PS_B$ of the plasma generation space PS. When an RF power is applied from the RF power supply 32 to the susceptor 12, the etching gas starts electric discharge first at the peripheral plasma region $PS_B$ with the magnetic field formed therein. Then, the electric discharge instantaneously spreads over the entire plasma generation space PS, thereby establishing glow discharge or plasma generation. The RF discharge thus started is assisted or sustained thereafter also by the magnetic field formed within the peripheral plasma region $PS_B$. As a consequence, as long as the etching gas and the RF power are supplied, electric discharge or plasma generation is stably sustained within the entire plasma generation space PS.

The magnetic field contribute to start and sustainment of the RF discharge, because electric charges (mainly electrons) drifting within the RF electric field receive a force (Lorentz force) from the magnetic field, and generate accelerated velocity in the direction of the force, thereby increasing the energy for ionizing gas molecules and atoms. It should be noted that, within the peripheral plasma region $PS_B$, the RF electric field is formed mainly between the inner wall (ceiling and sidewall) of the process chamber 10 and the lower electrode 12.

As described above, the magnetic field formed within the peripheral plasma region $PS_B$ triggers start of RF discharge and assists sustainment of the electric discharge. As a consequence, it is possible to easily start the electric discharge and stably sustain the electric discharge, even under conditions with a low gas pressure (for example, 10 mTorr or less), small inter-electrode gap, and low RF applied voltage. As an example, in the case of an etching process for poly-crystalline silicon, which employs only HBr gas as an etching gas, the conventional technique cannot start electric discharge (plasma ignition) if the gas pressure is 5 mTorr or less. On the other hand, it has been confirmed that, in the same etching process, this embodiment can reliably start electric discharge and stably sustain the electric discharge even if the gas pressure is 5 mTorr or less.

Further, the magnetic field forming mechanism 66 sets the main plasma region $PS_A$ to have substantially no magnetic field. As a consequence, it is possible to prevent or reduce the probability that the semiconductor wafer W placed on the susceptor 12 is affected by a magnetic field and devices formed on the wafer are thereby damaged or given stress. The state with no magnetic field, in which devices formed on the wafer are not damaged or given stress, is preferably a state having a magnetic field intensity of the geomagnetic level (for example 0.5 G) or less, but some processes are not affected by an intensity of about 5 G (which can be called a state with substantially no magnetic field).

Figure 2:
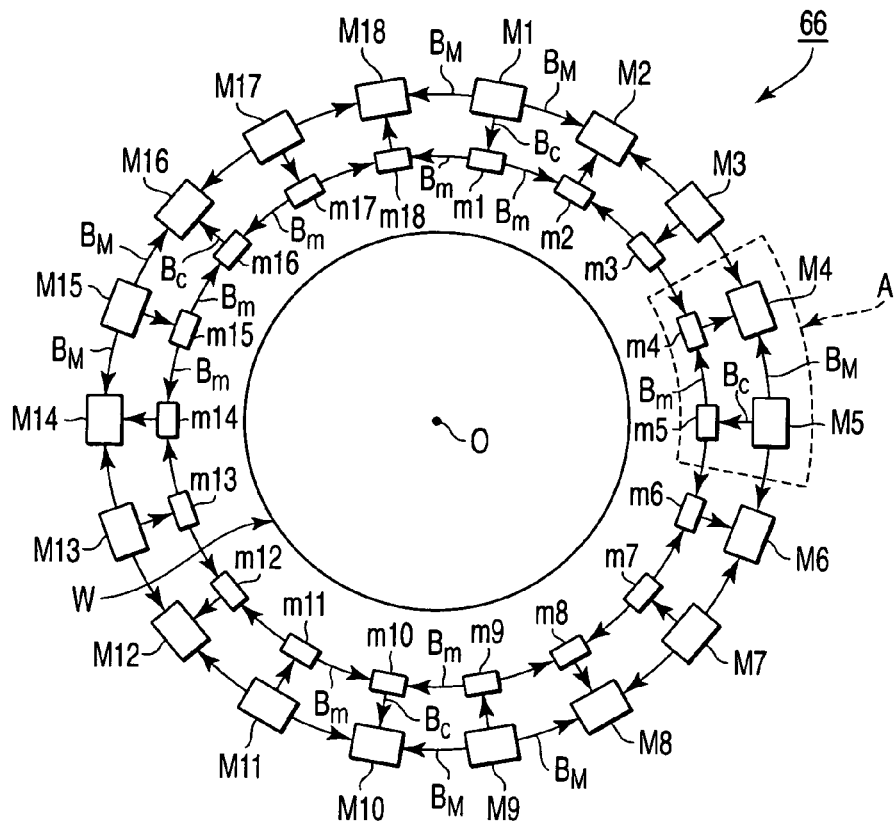
FIG. 2 is a plan view showing a main part of the magnetic field forming mechanism of the apparatus shown in FIG. 1.
Figure 3:
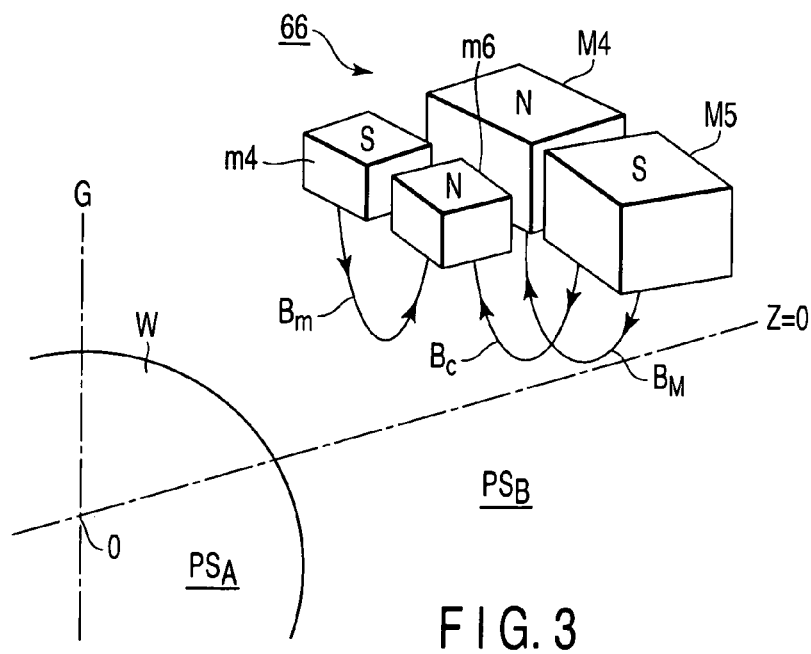
FIG. 3 is an enlarged perspective view showing a part of the magnetic field forming mechanism shown in FIG. 2.
Figure 4:
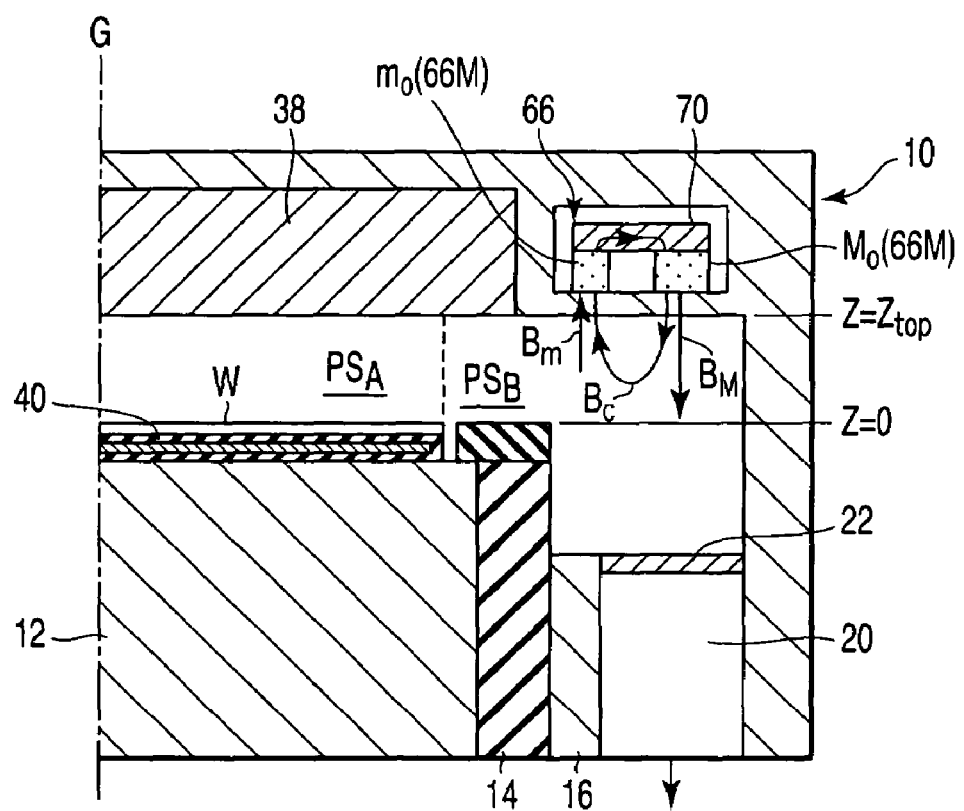
FIG. 4 is a sectional view showing a main part of the magnetic field forming mechanism of the apparatus shown in FIG. 1.

FIGS. 2 and 4 are a plan view and a sectional view, respectively, showing a main part of the magnetic field forming mechanism 66 of the apparatus shown in FIG. 1. FIG. 3 is an enlarged perspective view schematically showing a part (portion A circled by a broken line) of the mechanism shown in FIG. 2 (a plan view).

As shown in FIGS. 2 and 3, the magnetic field forming mechanism 66 includes an outer magnet ring 66M consisting of the number N of segment magnets M annularly arrayed at regular intervals such that their magnetic poles are alternately inverted. The magnetic field forming mechanism 66 also includes an inner magnet ring 66m consisting of the number N of segment magnets m annularly arrayed at regular intervals such that their magnetic poles are alternately inverted. This example is arranged in accordance with N=18.

For the outer magnet ring 66M, each segment magnet M is formed of a permanent magnet, such as a rare earth magnet (e.g., samarium-cobalt magnet, neodymium magnet), with a rectangular parallelepiped shape. Each of the odd-numbered segment magnets $M_O$ is disposed to direct the N-pole face downward, while each of the even-numbered segment magnets $M_E$ is disposed to direct the S-pole face downward. Some lines $B_M$ of the magnetic force lines emitted from the bottom side (N-pole) of each odd-numbered segment magnet $M_O$ extend along an essentially vertical plane to reach the bottom side (S-pole) of an even-numbered segment magnet $M_E$ adjacent thereto in the annular direction, such that these lines once go down into the peripheral plasma region $PS_B$ directly therebelow, and then make U-turns upward to describe parabolas.

On the other hand, for the inner magnet ring 66m, each segment magnet m is formed of a permanent magnet, such as a rare earth magnet (e.g., samarium-cobalt magnet, neodymium magnet), with a rectangular parallelepiped shape. Each of the odd-numbered segment magnets $m_O$ is disposed to direct the S-pole face downward, while each of the even-numbered segment magnets $m_E$ is disposed to direct the N-pole face downward. Some lines $B_m$ of the magnetic force lines emitted from the bottom side (N-pole) of each even-numbered segment magnet $m_E$ extend along an essentially vertical plane to reach the bottom side (S-pole) of an odd-numbered segment magnet $m_O$ adjacent thereto in the annular direction, such that these lines once go down into the peripheral plasma region $PS_B$ directly therebelow, and then make U-turns upward to describe parabolas.

Between the outer magnet ring 66M and inner magnet ring 66m, some lines $B_C$ of the magnetic force lines emitted from the bottom side (N-pole) of each odd-numbered segment magnet $M_O$ of the outer magnet ring 66M extend along an essentially vertical plane to reach the bottom side (S-pole) of an odd-numbered segment magnet $m_O$ of the inner magnet ring 66m adjacent thereto in the radial direction, such that these lines once go down into the peripheral plasma region $PS_B$ directly therebelow, and then make U-turns upward to describe parabolas. Also, some lines $B_C$ of the magnetic force lines emitted from the bottom side (N-pole) of each even-numbered segment magnet $m_E$ of the inner magnet ring 66m extend along an essentially vertical plane to reach the bottom side (S-pole) of an even-numbered segment magnet $M_E$ of the outer magnet ring 66M adjacent thereto in the radial direction, such that these lines once go down into the peripheral plasma region $PS_B$ directly therebelow, and then make U-turns upward to describe parabolas.

As shown in FIG. 4, a yoke 70 is disposed on or above the outer magnet ring 66M and inner magnet ring 66m. The yoke 70 expands continuously over all the outer segment magnets M and inner segment magnets m. The magnetic poles on the backsides (top sides) of the segment magnets $M_O$, $M_E$, $m_O$, and $m_E$ adjacent to each other in the annular direction or in the radial direction are magnetically coupled through the yoke 70. More specifically, the magnetic force lines emitted from the backside (N-pole) of each even-numbered segment magnet $M_E$ of the outer magnet ring 66M extend through the yoke 70, and reach the backside (S-pole) of an odd-numbered segment magnet $M_O$ adjacent thereto in the annular direction, or reach the backside (S-pole) of an even-numbered segment magnet $m_E$ of the inner magnet ring 66m adjacent thereto in the radial direction. Also, the magnetic force lines emitted from the backside (N-pole) of each odd-numbered segment magnet $m_O$ of the inner magnet ring 66m extend through the yoke 70, and reach the backside (S-pole) of an even-numbered segment magnet $m_E$ adjacent thereto in the annular direction, or reach the backside (S-pole) of an odd-numbered segment magnet $M_O$ of the outer magnet ring 66M adjacent thereto in the radial direction.

As described above, according to the magnetic field forming mechanism 66, an outer multi-polar magnetic field (first magnetic field) is formed within the peripheral plasma region $PS_B$ by the outer magnet ring 66M such that magnetic force lines $B_M$ extend substantially along an essentially vertical outer cylindrical plane corresponding to the diameter of the ring 66M. Further, an inner multi-polar magnetic field (second magnetic field) is formed within the peripheral plasma region $PS_B$ by the inner magnet ring 66m such that magnetic force lines $B_m$ extend substantially along an essentially vertical inner cylindrical plane corresponding to the diameter of the ring 66m. Furthermore, a multi-polar magnetic field (third magnetic field) is formed within the peripheral plasma region $PS_B$ by the outer magnet ring 66M and inner magnet ring 66m such that magnetic force lines $B_C$ extend substantially along a plurality of essentially vertical radial planes between the outer cylindrical plane and inner cylindrical plane.

The magnetic force line loop structure described above can increase the magnetic flux density within the peripheral plasma region $PS_B$, and effectively prevent magnetic force lines from entering the main plasma region $PS_A$. In order to further enhance these effects of the magnetic force line loop structure, the outer segment magnets M and the inner segment magnets m are preferably arranged such that the former ones M more distant from the substrate W have a larger magnetic quantity (magnetic pole intensity), while the latter ones m closer to the substrate W have a smaller magnetic quantity (magnetic pole intensity). Of the three different vertical magnetic fields $B_M$, $B_m$, and $B_C$, the magnetic field $B_M$ along the outer cylindrical plane and the magnetic field $B_C$ along the radial planes play a major role in the effects of this embodiment. On the other hand, the magnetic field $B_m$ along the inner cylindrical plane does not play a major role, and thus can be set negligibly small.

The respective portions of the magnetic field forming mechanism 66 (particularly the magnet rings 66M and 66m) are disposed directly above the peripheral plasma region $PS_B$, i.e., radially inside the sidewall of the process chamber 10. The magnetic field forming mechanism thus has a smaller radial distance from the center of the process chamber and a smaller peripheral length, as compared to a case where a magnetic field forming mechanism is disposed outside the sidewall of the process chamber 10. In this case, the number of magnets or magnetic poles and the magnetic quantity thereof (in proportion to the size or volume) can be remarkably reduced in forming a suitable profile of a magnetic field within the peripheral plasma region $PS_B$. As a consequence, it is possible to suppress increase in the apparatus size and cost due to the installation of the magnetic field forming mechanism 66, to the minimum.

It should be noted that a suitable profile of the magnetic field within the peripheral plasma region $PS_B$ is a profile that can provide a strong magnetic field near the main plasma region $PS_A$ as close as possible, without magnetically affecting the main plasma region $PS_A$. In this embodiment, the number N of the magnets M and m (or magnetic poles) and the magnetic quantity thereof are suitably selected for the outer magnet ring 66M and inner magnet ring 66m to attain a magnetic field with a preferable profile.

FIGS. 5A and 5B are graphs showing magnetic field intensity distributions according to present examples within the plasma generation space PS. In the present examples, it is assumed that a semiconductor wafer having a diameter of 300 mm is used as a target substrate W, the inner diameter of the process chamber 10 is about 260 mm, and the inter-electrode gap is 25 mm, while the number N of magnetic poles is used as a parameter (N=26, 28, 30, and 32). FIG. 5A shows radial direction distributions of the magnetic field intensity (the average value in the annular direction) at the position on the bottom surface of the upper electrode 38 (at the top position of the inter-electrode gap: Z=25 mm). FIG. 5B shows radial direction distributions of the magnetic field intensity (the average value in the annular direction) at the position on the top surface of the semiconductor wafer W placed on the susceptor 12 (at the bottom position of the inter-electrode gap: Z=0 mm).

As shown in FIGS. 5A and 5B, the peak values of the magnetic field intensity within the peripheral plasma region $PS_B$ (R>150 mm) are as high as 80 G to 800 G, and thus are sufficient to trigger start of RF discharge and assist sustainment of the electric discharge. As shown in FIG. 5A, at the top position of the inter-electrode gap (Z=25 mm), the magnetic field intensity scarcely varies with change in the number N of magnetic poles, at the respective positions in the radial direction. On the other hand, as shown in FIG. 5B, at the bottom position of the inter-electrode gap (Z=0 mm), the magnetic field intensity decreases with increase in the number N of magnetic poles, at the respective positions in the radial direction, and the magnetic field intensity becomes very close to zero near the wafer edge (R=150 mm). According to the present examples, where the number N is set to be 30 (poles) or more, the magnetic field intensity at the wafer edge (R=150 mm) position decreases to the geomagnetic level (0.5 G) or less.

FIGS. 5A and 5B also show a comparative example with a broken line, in which the magnetic field forming mechanism 66 is changed to exclude the inner magnet ring 66m but to include the outer magnet ring 66M. In the case of the comparative example, a substantial magnetic field is also formed within the main plasma region $PS_A$ (R≦150 mm). This is so, because some of the magnetic force lines emitted from the N-poles on the bottom side of the magnets M of the outer magnet ring 66M do not make U-turns upward, but diverge radially inside the main plasma region $PS_A$. On the other hand, according to this embodiment, the outer magnet ring 66M is combined with the inner magnet ring 66m, so that the main plasma region $PS_A$ is effectively and reliably set to have substantially no magnetic field.

The magnetic field intensity distributions shown in FIGS. 5A and 5B are states at the top position of the inter-electrode gap (Z=25 mm) and at the bottom position of the inter-electrode gap (Z=0 mm), respectively. It can be easily understood that positions between the electrodes (0 mm<Z<25 mm) have magnetic field intensity distributions intermediate between those shown in FIGS. 5A and 5B.

Figure 6A:
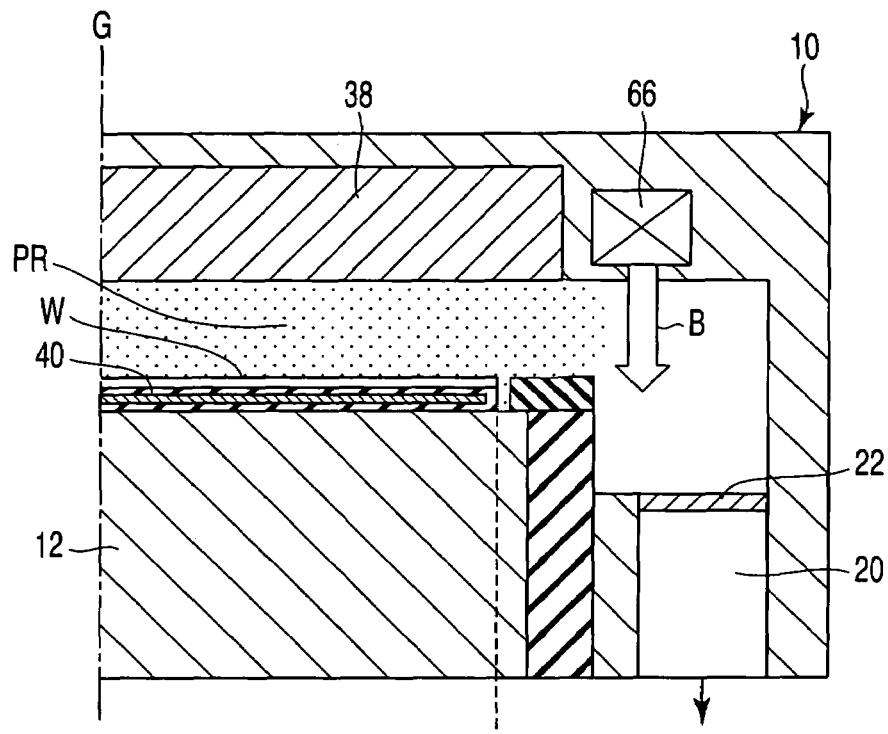
FIG. 6A is a sectional view schematically showing one function of the magnetic field forming mechanism of the apparatus shown in FIG. 1.
Figure 6B:
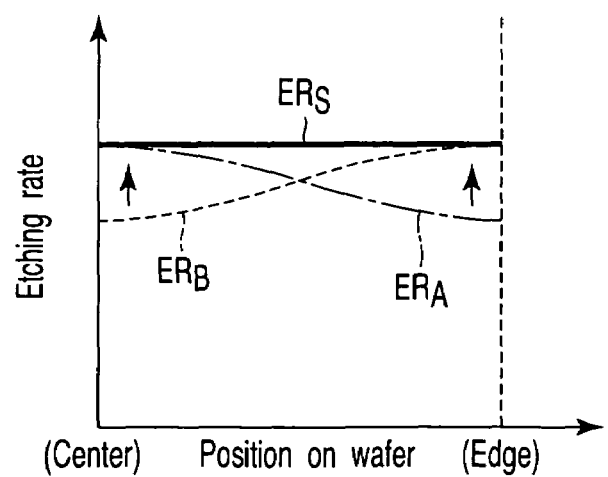
FIG. 6B is a graph showing the relationship between the magnetic field formation and etching rate (normalized value)

In another aspect of this embodiment, the magnetic field forming mechanism 66 forms a magnetic field B vertically extending like a curtain surrounding the main plasma region $PS_A$ (i.e., a magnetic field perpendicular to the diffusion direction of plasma). FIG. 6A is a sectional view schematically showing one function of the magnetic field forming mechanism of the apparatus shown in FIG. 1, in this aspect. FIG. 6B is a graph showing the relationship between the magnetic field formation and etching rate (normalized value). As shown in FIG. 6A, this curtain-type vertical magnetic field B prevents plasma PR from flowing out of the main plasma region $PS_A$, and thus effectively and efficiently confines the plasma PR therein. As a consequence, the plasma PR can have a higher density and higher uniformity within the main plasma region $PS_A$, thereby improving the plasma etching property on the semiconductor wafer W.

For example, a structure can be assumed such that no curtain-type vertical magnetic field B is formed within the peripheral plasma region $PS_B$. If such a structure is applied to processes for oxide films (for example, etching of a silicon oxide film), the etching rate is apt to decrease on the wafer edge side relative to the wafer central side, as shown by a chain line $ER_A$ in FIG. 6B. Also, if such a structure is applied to processes for poly-crystals (for example, etching of polycrystalline silicon), the etching rate is apt to decrease on the wafer central side relative to the wafer edge side, as shown by a broken line $ER_B$ in FIG. 6B.

On the other hand, according to this embodiment, a curtain-type vertical magnetic field B is formed within the peripheral plasma region $PS_B$ by the magnetic field forming mechanism 66. Where this arrangement is applied to processes for oxide films, the etching rate recovers on the wafer edge side more than the wafer central side to improve the planar uniformity, as shown by a solid line $ER_S$ in FIG. 6B. Also, where this arrangement is applied to processes for poly-crystals, the etching rate recovers on the wafer central side more than the wafer edge side to improve the planar uniformity, as shown by a solid line $ER_S$ in FIG. 6B.

Figure 7:
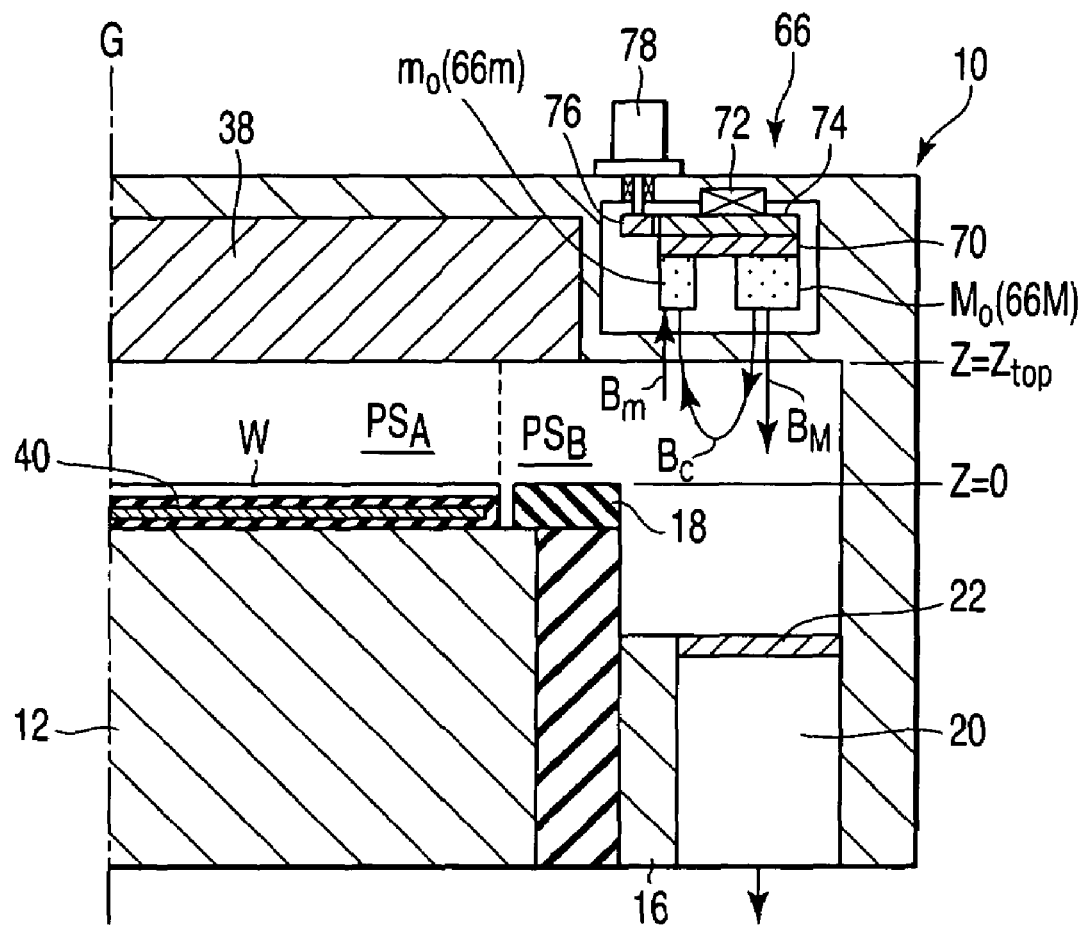
FIG. 7 is a sectional view showing a modification of the magnetic field forming mechanism of the apparatus shown in FIG. 1.

FIG. 7 is a sectional view showing a modification of the magnetic field forming mechanism 66 of the apparatus shown in FIG. 1. According to this modification, the outer magnet ring 66M and inner magnet ring 66m are rotatable at a constant speed about a vertical line G extending through the center of the process chamber 10 (the center O of the semiconductor wafer W). In other words, the magnetic field forming mechanism 66 includes a rotation mechanism for integratedly rotating the first, second, and third magnetic fields in the annular direction.

More specifically, the outer magnet ring 66M and inner magnet ring 66m are attached through the yoke 70 to a ring-like internal gear 74 rotatable about a guide 72. An external gear 76 engages with the internal gear 74 and connected to the rotary shaft of an electric motor 78. With this arrangement, a uniform magnetic field intensity distribution can be obtained in the annular direction, even where the number N of magnetic poles of the outer magnet ring 66M or inner magnet ring 66m is small. Particularly, there is a case where a deposition film is formed on the ceiling of the process chamber 10 directly below the magnetic field forming mechanism 66 due to the vertical magnetic field. In this case, the uniform magnetic field intensity distribution allows the conditions and thickness of the deposition film to be uniform over the entire circumference.

In the magnetic field forming mechanism 66 shown in FIG. 2, the outer magnet ring 66M is arranged such that each of the odd-numbered segment magnets $M_O$ is disposed to direct the N-pole face downward, while each of the even-numbered segment magnets $M_E$ is disposed to direct the S-pole face downward. Further, the inner magnet ring 66m is arranged such that each of the odd-numbered segment magnets $m_O$ is disposed to direct the S-pole face downward, while each of the even-numbered segment magnets $m_E$ is disposed to direct the N-pole face downward. However, the magnets $M_O$, $M_E$, $m_O$, and $m_E$ may be disposed to inversely direct their magnetic poles, such that the S-pole of each $M_O$, the N-pole of each $M_E$, the N-pole of each $m_O$, and the S-pole of each $m_E$ are directed downward.

In FIG. 1, the plasma processing apparatus provided with the magnetic field forming mechanism 66 is of the parallel-plate type in which an RF power for plasma generation is applied to the susceptor 12. Alternatively, the plasma etching apparatus may be of the type in which an RF power for plasma generation is applied to the upper electrode 38. Further, the plasma etching apparatus may be of the type in which first and second RF powers with different frequencies are respectively applied to the upper electrode 38 and susceptor 12 (the type applying RFs to the upper and lower side). Furthermore, the plasma etching apparatus may be of the type in which first and second RF powers with different frequencies are superimposed and applied to the susceptor 12 (the type applying superimposed two frequencies to the lower side).

The mechanism for exciting plasma is not limited to those of the parallel-plate type, and it may be of another RF discharge type, such as the helicon wave plasma type. Further, the process performed by the plasma processing apparatus is not limited to plasma etching, and it may be another plasma process, such as plasma CVD, plasma oxidation, plasma nitridation, or sputtering. In the broad sense, the present invention is applicable to various plasma processing apparatuses which utilize an RF electric field formed within a pressure-reduced process chamber. A plasma processing apparatus according to the present invention may be combined with the ignition plasma method. Further, the target substrate is not limited to a semiconductor wafer, and it may be one of various substrates for flat panel displays, or a photo-mask, CD substrate, or printed circuit board.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus comprising:
a process chamber configured to reduce a pressure therein;
a worktable disposed in the process chamber and configured to place a target substrate thereon in an essentially horizontal state, a plasma generation space being defined above and around the worktable within the process chamber, and the plasma generation space including a peripheral plasma region and a main plasma region respectively located outside and inside an outer edge of the target substrate placed on the worktable;
a process gas supply section configured to supply a process gas into the plasma generation space;
an electric field forming mechanism configured to form an RF electric field within the plasma generation space; and
a magnetic field forming mechanism located above and extending concentrically with the peripheral plasma region, and comprising first N-poles, first S-poles, second N-poles, and second S-poles, which are arrayed in a same horizontal level and face downward above the target substrate such that each of the first N-poles, first S-poles, second N-poles, and second S-poles are oriented vertically so as to extend respective magnetic force lines downward therefrom,
wherein the first N-poles and the first S-poles are alternately disposed at intervals in a first annular direction outside the outer edge of the target substrate, while the second N-poles and the second S-poles are alternately disposed at intervals in a second annular direction outside the outer edge of the target substrate and inside the first annular direction, to set the peripheral plasma region to have a magnetic field vertically extending as a curtain surrounding the main plasma region and to set the main plasma region to have substantially no magnetic field, and
wherein each set of one of the first N-poles and one of the second S-poles is arrayed substantially in a radial direction, and each set of one of the first S-poles and one of the second N-poles is arrayed substantially in a radial direction.

2. The apparatus according to claim 1, wherein an upper electrode and a lower electrode functioning as the worktable are disposed in parallel with each other with a gap therebetween within the process chamber; the plasma generation space is defined within a space surrounded by the upper electrode, the lower electrode, and a sidewall of the process chamber; the electric field forming mechanism is configured to apply an RF power across the upper electrode and the lower electrode; and the process gas supply section is configured to supply the process gas between the upper electrode and the lower electrode.

3. The apparatus according to claim 1, wherein the magnetic field comprises a first magnetic field formed of magnetic force lines that make U-turns extending through the peripheral plasma region from start positions defined by the first N-poles to end positions defined by the first S-poles.

4. The apparatus according to claim 3, wherein the magnetic field comprises a second magnetic field formed of magnetic force lines that make U-turns extending through the peripheral plasma region from start positions defined by the second N-poles to end positions defined by the second S-poles.

5. The apparatus according to claim 4, wherein the magnetic field comprises a third magnetic field formed of magnetic force lines that make U-turns extending through the peripheral plasma region from start positions defined by the first and second N poles to end positions defined by the first and second S-poles.

6. The apparatus according to claim 1, wherein the magnetic field forming mechanism comprises a plurality of magnets combined to provide the first N-poles, the first S-poles, the second N-poles, and the second S-poles.

7. The apparatus according to claim 6, wherein the magnetic field forming mechanism further comprises a yoke disposed in contact with or close to a backside of the magnets reverse to the peripheral plasma region.

8. The apparatus according to claim 7, wherein the yoke expands continuously over all the magnets.

9. The apparatus according to claim 1, wherein the magnetic field forming mechanism further comprises a rotation mechanism configured to integratedly rotate the first N-poles, the first S-poles, the second N-poles, and the second S-poles in an annular direction.

10. The apparatus according to claim 1, wherein the a process gas supply section comprises a showerhead having a plurality of gas delivery holes in a lower surface facing the main plasma region.

11. A plasma etching apparatus comprising:
a process chamber configured to reduce a pressure therein;
a worktable disposed in the process chamber and configured to place a target substrate thereon in an essentially horizontal state, a plasma generation space being defined above and around the worktable within the process chamber, and the plasma generation space including a peripheral plasma region and a main plasma region respectively located outside and inside an outer edge of the target substrate placed on the worktable;
a process gas supply section configured to supply an etching gas for etching the target substrate into the plasma generation space, the process gas supply section comprising a showerhead disposed above the worktable in the process chamber and having a plurality of gas delivery holes in a lower surface facing the main plasma region;
an electric field forming mechanism comprising a lower electrode combined with the worktable and an upper electrode combined with the showerhead, and configured to apply an RF power across the lower electrode and the upper electrode to form an RF electric field within the plasma generation space; and
a magnetic field forming mechanism located above and extending concentrically with the peripheral plasma region, and comprising first N-poles, first S-poles, second N-poles, and second S-poles, which are arrayed in a same horizontal level and face downward above the target substrate such that each of the first N-poles, first S-poles, second N-poles, and second S-poles are oriented vertically so as to extend respective magnetic force lines downward therefrom,
wherein the first N-poles and the first S-poles are alternately disposed at intervals in a first annular direction outside the outer edge of the target substrate, while the second N-poles and the second S-poles are alternately disposed at intervals in a second annular direction outside the outer edge of the target substrate and inside the first annular direction, to set the peripheral plasma region to have a magnetic field vertically extending as a curtain surrounding the main plasma region and to set the main plasma region to have substantially no magnetic field, and
wherein each set of one of the first N-poles and one of the second S-poles is arrayed substantially in a radial direction, and each set of one of the first S-poles and one of the second N-poles is arrayed substantially in a radial direction.

12. The apparatus according to claim 11, wherein the magnetic field forming mechanism comprises a plurality of magnets combined to provide the first N- poles, the first S-poles, the second N-poles, and the second S-poles.

13. The apparatus according to claim 12, wherein the magnetic field forming mechanism further comprises a yoke disposed in contact with or close to a backside of the magnets reverse to the peripheral plasma region.

14. The apparatus according to claim 13, wherein the yoke expands continuously over all the magnets.

15. The apparatus according to claim 11, wherein the magnetic field forming mechanism further comprises a rotation mechanism configured to integratedly rotate the first N-poles, the first S-poles, the second N-poles, and the second S-poles in an annular direction.

* * * * *